US008358016B2

(12) United States Patent
Suh et al.

(10) Patent No.: US 8,358,016 B2
(45) Date of Patent: Jan. 22, 2013

(54) SEMICONDUCTOR PACKAGE HAVING AN INTERNAL COOLING SYSTEM

(75) Inventors: Min Suk Suh, Seoul (KR); Chang Jun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/418,845

(22) Filed: Mar. 13, 2012

(65) Prior Publication Data

US 2012/0175783 A1 Jul. 12, 2012

Related U.S. Application Data

(62) Division of application No. 12/639,222, filed on Dec. 16, 2009, now Pat. No. 8,159,065.

(30) Foreign Application Priority Data

Mar. 6, 2009 (KR) .................. 10-2009-0019114
Mar. 6, 2009 (KR) .................. 10-2009-0019180

(51) Int. Cl.
*H01L 23/34* (2006.01)
*H01L 25/065* (2006.01)
*H01L 23/538* (2006.01)

(52) U.S. Cl. ............. 257/777; 257/686; 257/E23.097; 257/E23.098; 257/E23.099; 438/667; 438/675

(58) Field of Classification Search .......... 257/621, 257/686, 777, E23.098, E23.099; 438/667, 438/675
See application file for complete search history.

(56) References Cited

U.S. PATENT DOCUMENTS

| | | | |
|---|---|---|---|
| 4,954,875 A | 9/1990 | Clements | |
| 5,408,123 A | 4/1995 | Murai | |
| 6,566,232 B1 | 5/2003 | Hara et al. | |
| 7,786,573 B2 | 8/2010 | Choi et al. | |
| 2002/0030245 A1 | 3/2002 | Hanaoka et al. | |
| 2008/0099909 A1* | 5/2008 | Baek et al. ............ | 257/715 |
| 2009/0057881 A1 | 3/2009 | Arana et al. | |
| 2009/0267194 A1 | 10/2009 | Chen | |
| 2009/0294954 A1* | 12/2009 | Bakir et al. ............ | 257/713 |

FOREIGN PATENT DOCUMENTS

| | | |
|---|---|---|
| JP | 10-340846 A | 12/1998 |
| JP | 11-168112 A | 6/1999 |
| JP | 2007-533170 A | 11/2007 |
| JP | 2008-047895 A | 2/2008 |
| KR | 1019990036886 A | 5/1999 |
| KR | 1020060064518 A | 6/2006 |
| KR | 1020060070140 A | 6/2006 |
| KR | 1020080038577 A | 5/2008 |
| WO | 2005/114061 A2 | 12/2005 |

OTHER PUBLICATIONS

USPTO RR mailed Aug. 8, 2011 in connection with U.S. Appl. No. 12/639,222.
USPTO NFOA mailed Sep. 26, 2011 in connection with U.S. Appl. No. 12/639,222.
USPTO NOA mailed Dec. 28, 2011 in connection with U.S. Appl. No. 12/639,222.

* cited by examiner

*Primary Examiner* — Peniel M Gumedzoe
(74) *Attorney, Agent, or Firm* — Ladas & Parry LLP

(57) ABSTRACT

A semiconductor package having an internal cooling system is presented which includes a semiconductor chip and a through-electrode. The semiconductor chip has a circuit section. The through-electrode passes through an upper surface and a lower surface the semiconductor chip. The through-electrode is electrically connected with the circuit section of the semiconductor chip. The through-electrode also has a through-hole for allowing cooling fluid to flow therethrough.

17 Claims, 9 Drawing Sheets

SEMICONDUCTOR PACKAGE HAVING AN INTERNAL COOLING SYSTEM

CROSS-REFERENCE TO RELATED APPLICATIONS

The present application claims priorities to Korean patent application number 10-2009-0019114 filed on Mar. 6, 2009 and Korean patent application number 10-2009-0019180 filed on Mar. 6, 2009, which are incorporated herein by reference in their entireties.

BACKGROUND OF THE INVENTION

The present invention relates to a semiconductor package.

These days, semiconductor packages appropriate for storing and processing huge amounts of data have been developed.

Recently stacked semiconductor packages have been developed in which at least two semiconductor chips are stacked so as to increase the data storage capacity and to increase data processing speeds.

In the case where semiconductor chips are stacked to form the stacked semiconductor package, heat generated in the respective semiconductor chips cannot be efficiently dissipated. Due to this fact, the performance of the respective semiconductor chips in the stacked semiconductor package can significantly degrade.

Even though it has been suggested to dispose heat dissipation plates on the outer surface of a stacked semiconductor package has been suggested, excessive heat still persists in the stacked semiconductor package. As a result, problems still remain in finding a way to quickly dissipate heat away from the semiconductor chips disposed in the stacked semiconductor package configurations.

BRIEF SUMMARY OF THE INVENTION

Embodiments of the present invention are directed to semiconductor packages that have appropriate structures that allow for quick dissipation of heat generated in a semiconductor chip to be removed outside of the semiconductor chip.

In one embodiment of the present invention, a semiconductor package comprises a semiconductor chip having a circuit section; and a through-electrode that passes through an upper surface and a lower surface, the lower surface faces away from the upper surface of the semiconductor chip, the through-electrode is electrically connected with the circuit section, and defined with a through-hole for allowing cooling fluid to flow therethrough.

The semiconductor package may further comprise a corrosion-resistant layer formed on an inner surface of the through-electrode which is formed by defining the through-hole.

The through-electrode may have a pipe conduit shape.

The semiconductor package may further comprise a substrate having a substrate body possessing a chip region in which the semiconductor chip is disposed and a peripheral region which is defined around the chip region, and a path which is defined in the substrate body and which extends from the chip region to the peripheral region; and a molding member covering the semiconductor chip and having an opening which fluidly communicates with the through-hole.

A plurality of semiconductor chips may be stacked together, and through-electrodes of the respective semiconductor chips may be aligned with each other.

The semiconductor package may further comprise a circulation pump unit having a first pipe connected to the opening of the molding member, a second pipe connected to an end of the path which is formed in the peripheral region, and a circulation pump which fluidly connects the first and second pipes with each other.

The semiconductor package may further comprise cooling fluid filled into the first and second pipes and the through-holes and circulated by the circulation pump.

The semiconductor package may further comprise connection members placed on at least one end of both ends of the through-electrodes and having a ring shape which has an opening corresponding to the through-hole.

The semiconductor package may further comprise column-shaped heat conductive members filling the through-holes of the through-electrodes and openings of the connection members, and containing a heat conductive material.

The through-electrode may have a first volume, and the heat conductive member may have a second volume greater than the first volume.

The through-electrode may have a first volume, and the heat conductive member may have a second volume less than the first volume.

The heat conductive member may have pores for improve heat transfer efficiency.

The semiconductor package may further comprise a substrate having the semiconductor chips disposed thereon and defined with openings at positions which correspond to the through-electrodes; and a molding member covering the semiconductor chips.

The molding member has openings which expose the heat conductive members.

In another embodiment of the present invention, a semiconductor package comprises a substrate having a chip region and a peripheral region which is defined around the chip region, and defined with a path which extends from the chip region to the peripheral region; a semiconductor chip module having at least two semiconductor chips which are stacked in the chip region separately from each other and are defined with through-holes; and a molding member covering side surfaces and an upper surface of the semiconductor chip module to define a connection path for providing circulating cooling fluid to the semiconductor chips, which communicate with the through-holes, and defined with an opening which communicates with the through-hole defined in an uppermost semiconductor chip among the semiconductor chips.

The substrate may include connection pads which are formed in the chip region, and the semiconductor chip module may have through-electrodes which are formed to pass through the semiconductor chips and are electrically connected with the connection pads.

Any one of a gold layer and an insulation layer may be formed on a side surface of the through-electrode to inhibit or protect against corrosion of the through-electrode.

A through-electrode hole for forming the through-electrode may have a first diameter, and the through-hole may have a second diameter less than the first diameter.

The semiconductor package may further comprise a first pipe connected to the opening of the molding member; a second pipe connected to the path; and a circulation pump connected to the first and second pipes to circulate cooling fluid filled in the first and second pipes and the cooling spaces.

The semiconductor package may further comprise a first sealing member for closing the opening of the molding member; a second sealing member for closing the path; cooling fluid filled in the cooling spaces; and a circulation pump for circulating the cooling fluid.

The through-holes of a lower semiconductor chip which is placed downward among the semiconductor chips and an upper semiconductor chip which is placed on the lower semiconductor chip may be defined at the same positions.

The through-holes of a lower semiconductor chip which is placed downward among the semiconductor chips and an upper semiconductor chip which is placed on the lower semiconductor chip may be defined at different positions.

The semiconductor package may further comprise adhesive sealing members formed along edges of upper surfaces and lower surfaces, facing away from the upper surfaces, of the semiconductor chips in the form of a closed loop to prevent the molding member from flowing into the cooling spaces.

A height of the adhesive sealing member may be about half that of a distance by which adjoining semiconductor chips are separated from each other.

A height of the adhesive sealing member may be the same as a distance by which adjoining semiconductor chips are separated from each other.

DESCRIPTION OF SPECIFIC EMBODIMENTS

Hereafter, specific embodiments of the present invention will be described in detail with reference to the accompanying drawings.

It is understood herein that the drawings are not necessarily to scale and in some instances proportions may have been exaggerated in order to more clearly depict certain features of the invention.

Figure 1:
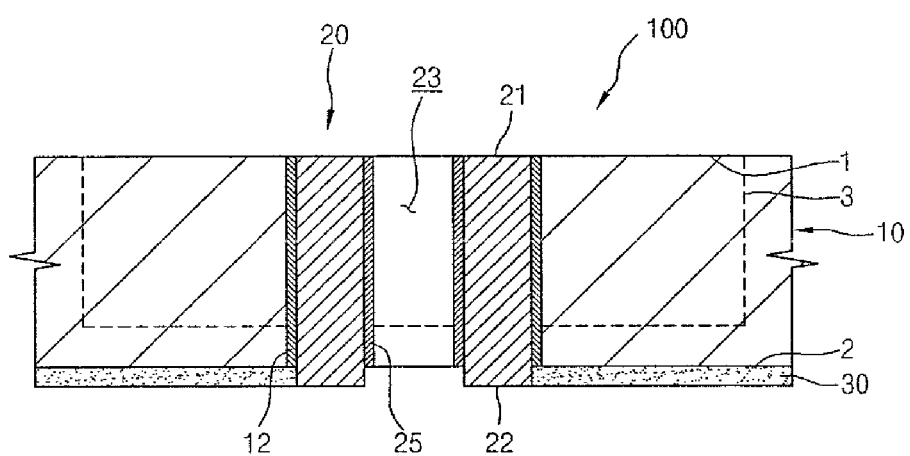
FIG. 1 is a cross-sectional view illustrating a semiconductor package in accordance with an embodiment of the present invention.

FIG. 1 is a cross-sectional view illustrating a semiconductor package in accordance with an embodiment of the present invention.

Referring to FIG. 1, a semiconductor package 100 includes a semiconductor chip 10 and through-electrodes 20. In addition, the semiconductor package 100 can include an adhesive member 30.

The semiconductor chip 10 possesses, for example, may have a rectangular hexahedral shape. The semiconductor chip 10 possessing the rectangular hexahedral shape has an upper surface 1 and a lower surface 2 which faces away from the upper surface 1. The semiconductor chip 10 includes a circuit section 3 which may have a data storage unit (not shown) for storing data and a data processing unit (not shown) for processing data.

Each through-electrode 20 passes through the upper surface 1 and the lower surface 2 of the semiconductor chip 10 and is electrically connected with the circuit section 3. Accordingly, an input signal can be transmitted from an external part is inputted to the circuit section 3 by way of the through-electrode 20, and likewise an output signal can be outputted from the circuit section 3 by being transmitted to the external part by way of the through-electrode 20.

An insulation layer 12 is formed between the through-electrode 20 and the semiconductor chip 10 which electrically insulates the through-electrode 20 and the semiconductor chip 10 from each other. The insulation layer 12 can comprise an organic layer or an inorganic layer.

In one embodiment, the through-electrode 20 can contain copper having excellent electrical conductivity and heat conductivity. Other embodiments for the material composition of the through-electrode 20 can of course contain any type of electrically conductive material such as aluminum or aluminum alloys exhibit excellent electrical conductivity and good heat conductivity properties.

In the embodiment, the through-electrode 20 has a first end 21 that corresponds to the upper surface 1 of the semiconductor chip 10 and a second end 22 that corresponds to the lower surface 2 of the semiconductor chip 10.

One variation is that the second end 22 of the through-electrode 20 can project outward away from the lower surface 2 of the semiconductor chip 10 by a predetermined thickness. Alternately another variation is that the second end 22 of the through-electrode 20 can be flush with respect the lower surface 2 of the semiconductor chip 10.

In order to improve heat dissipation efficiency of the semiconductor chip 10 by utilizing the through-electrode 20, the through-electrode 20 has a through-hole 23 that passes through the first and second ends 21 and 22 of the through-electrode 20. In this embodiment, cooling fluid such as liquefied nitrogen or cooling air flows through the through-hole 23. As a result, heat generated in the semiconductor chip 10 can be quickly dissipated to an outside by the cooling fluid that flows through the through-hole 23.

When the cooling fluid flows through the through-hole 23 defined in the through-electrode 20, the inner surface of the through-electrode 20 which is formed due to defining of the through-hole 23 is can be corroded as a result of being exposed to the cooling fluid. In order to cope with this problem, in the present invention, a corrosion-resistant layer 25 is formed on the inner surface of the through-electrode 20 to prevent the through-electrode 20 from becoming corroded. In the embodiment, the corrosion-resistant layer 25 can comprise an organic layer or an inorganic layer having a small thickness. If the corrosion-resistant layer 25 is not formed on the inner surface of the through-electrode 20, then the through-electrode 20 is prone to being corroded, and as a result the electrical characteristics of the through-electrode 20 can markedly deteriorate.

Figure 2:
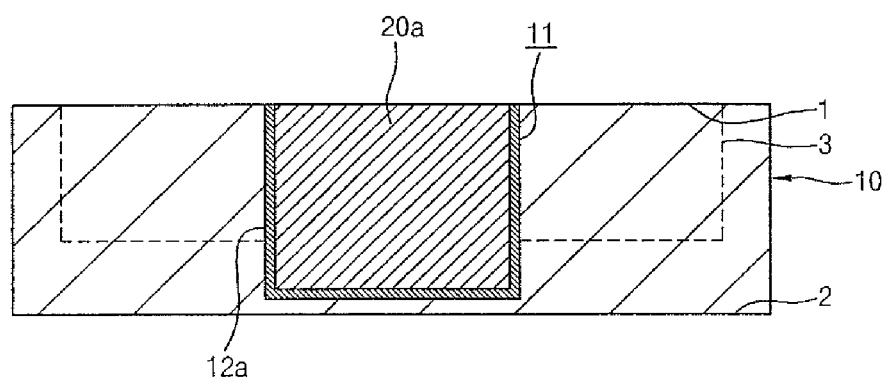
FIGS. 2 through 4 are cross-sectional views illustrating a method for manufacturing a semiconductor package in accordance with another embodiment of the present invention.
Figure 3:
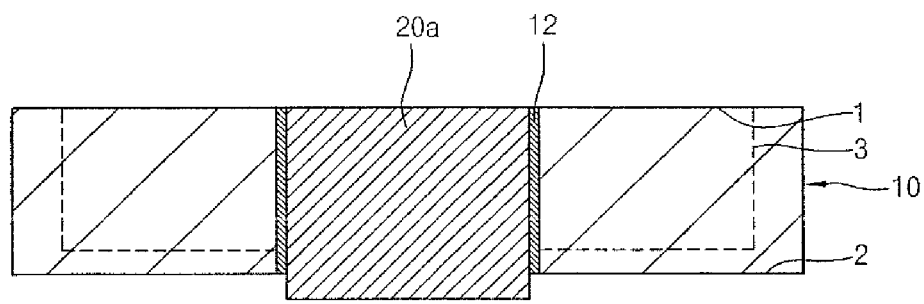
Figure 4:
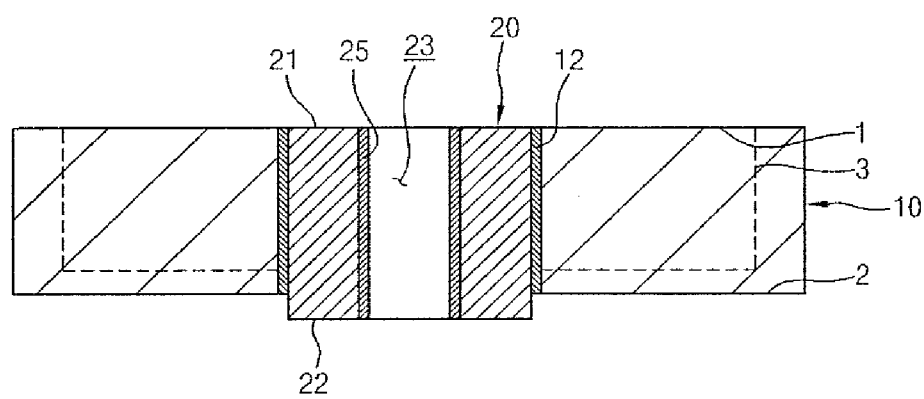

FIGS. 2 through 4 are cross-sectional views illustrating a method for manufacturing a semiconductor package in accordance with another embodiment of the present invention.

Referring to FIG. 2, a semiconductor chip 10, which is formed with a circuit section 3 that can have a data storage unit (not shown) and/or a data processing unit (not shown), is manufactured through a semiconductor chip manufacturing process.

After the semiconductor chip 10 is manufactured, a blind via 11 is defined from an upper surface 1 toward a lower surface 2, facing away from the upper surface 1, of the semiconductor chip 10. The blind via 11 can be defined through a drilling process, a laser drilling process or an etching process.

After the blind via 11 is defined in the semiconductor chip 10, a preliminary insulation layer 12a having a small thickness is formed on the inner surface of the semiconductor chip 10 which is formed in the blind via 11. The preliminary insulation layer 12a can comprise, for example, an organic layer or an inorganic layer.

Then, a preliminary through-electrode 20a is formed on the preliminary insulation layer 12a which is formed on the inner surface of the semiconductor chip 10, in such a way as to fill in the blind via 11. The preliminary through-electrode 20a has a column shape. The preliminary through-electrode 20a can comprise, for example, copper which exhibits excellent conductivity characteristics.

Referring to FIG. 3, after the preliminary through-electrode 20a is formed on the preliminary insulation layer 12a, the lower surface 2 of the semiconductor chip 10 is etched by using an etch-back process. Due to this fact, the preliminary through-electrode 20a having the column shape is then exposed at the lower surface 2 of the semiconductor chip 10. As a consequence, a through-electrode 20 is formed, and an insulation layer 12 that surrounds the side surface of the through-electrode 20 is formed.

Referring to FIG. 4, after the lower surface 2 of the semiconductor chip 10 is etched away, a through-hole 23 is defined. The through-hole 23 passes through the first end 21 of the through-electrode 20 which corresponds to the upper surface 1 of the semiconductor chip 10 and passes through the second end 22 of the through-electrode 20 which corresponds to the lower surface 2 of the semiconductor chip 10. The through-hole 23 can be established, for example, by using a drilling process, a laser drilling process or an etching process. Accordingly, a cooling fluid such as liquefied nitrogen or air flows can flow through the through-hole 23 and subsequently extract the excess heat generated away from the semiconductor chip 10.

When cooling fluid flows through the through-hole 23 defined through the through-electrode 20 which contains copper, an oxide layer can occur on the inner surface of the through-electrode 20 which defines the through-hole 23. If corrosion does occur, then the electrical characteristics of the through-electrode 20 can markedly deteriorate. In order to prevent the corrosion, such as an oxide layer, from being formed on the inner surface of the through-electrode 20, a corrosion-resistant layer 25 is formed on the inner surface of the through-electrode 20. The corrosion-resistant layer 25 can comprise any known type of corrosion-resistant material such as an organic layer or an inorganic layer.

Figure 5:
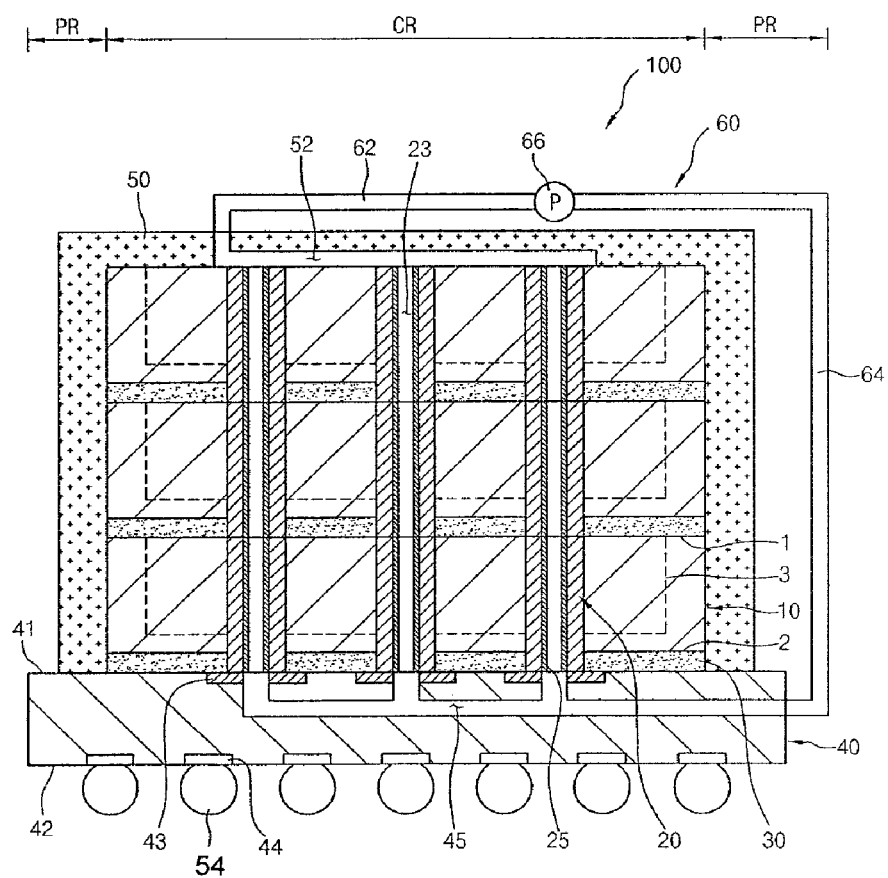
FIG. 5 is a cross-sectional view illustrating a semiconductor package in accordance with another embodiment of the present invention.

FIG. 5 is a cross-sectional view illustrating a semiconductor package in accordance with another embodiment of the present invention. The semiconductor package shown in FIG. 5 has substantially the same or equivalent construction as the semiconductor package described above with reference to FIG. 1, except a substrate 40, a molding member 50 and a circulation pump unit 60. Therefore, description for the same component parts will be omitted herein, and the same technical terms and the same reference numerals will be used to refer to the same or like component parts.

Referring to FIG. 5, a semiconductor package 100 includes semiconductor chips 10, through-electrodes 20, a substrate 40, a molding member 50, and a circulation pump unit 60.

At least two semiconductor chips 10, which have the through-electrodes 20 defined with through-holes 23 appropriate for allowing cooling fluid to flow therethrough as shown in FIG. 1, adhere to one another by adhesive members 30 which are attached to the lower surfaces 2 of the respective semiconductor chips 10. The through-holes 23, which are defined through the through-electrodes 20 of the semiconductor chips 10, communicate with one to another.

The semiconductor chips 10 which adhere to one another by the adhesive members 30 are attached to the substrate 40. The substrate 40 has a chip region CR and a peripheral region PR which is defined around the chip region CR. The stacked semiconductor chips 10 are securely disposed in the chip region CR of the substrate 40 by the adhesive member 30 which is attached to the semiconductor chip 10 positioned lowermost among the semiconductor chips 10 adhered to one another.

The substrate 40 includes a path 45 which extends from the chip region CR to the peripheral region PR. One end of the path 45 communicates with the through-holes 23 defined through the through-electrodes 20 of the semiconductor chips 10 which are disposed in the chip region CR.

Connection pads 43, which are electrically connected with the through-electrodes 20 of the lowermost semiconductor chip 10, are disposed on an upper surface 41 of the substrate 40, and ball lands 44, which are electrically connected with the connection pads 43, are disposed on a lower surface 42 of the substrate 40 facing away from the upper surface 41. Connection members 54 such as solder balls are disposed on the ball lands 44.

The molding member 50 covers the side surfaces and the upper surface of the stacked semiconductor chips 10. The molding member 50 comprises a molding element such as epoxy resin. The molding member 50 has a connection path 52 that communicates with the through-holes 23 defined through the through-electrodes 20 of the semiconductor chip 10 which is placed uppermost among the semiconductor chips 10. In the embodiment, the connection path 52 can be defined by forming a connection member when conducting a molding process using resin, to cover the respective through-holes 23 defined through the through-electrodes 20 of the uppermost semiconductor chip 10, by using a material which can be vaporized at a specified temperature or can be removed by a specified substance, and, after the molding process is conducted, by vaporizing or removing the connection member at the specified temperature or using the specified substance.

The circulation pump unit 60 includes a first pipe 62, a second pipe 64, and a circulation pump 66.

The first pipe 62 communicates with the connection path 52 which is defined in the molding member 50, and the second pipe 64 communicates with the path 45 which is exposed to the outside at or near the peripheral region PR of the substrate 40. The first and second pipes 62 and 64 are fluidly connected to each other by the circulation pump 66. Cooling fluid is can be supplied into the first and second pipes 62 and 64 and into the through-holes 23 defined through the through-electrodes 20 of the semiconductor chips 10. The cooling fluid is then circulated by the circulation pump 66. Exposed portions of the first and second pipes 62 and 64 can act as Heat exchangers.

Figure 6:
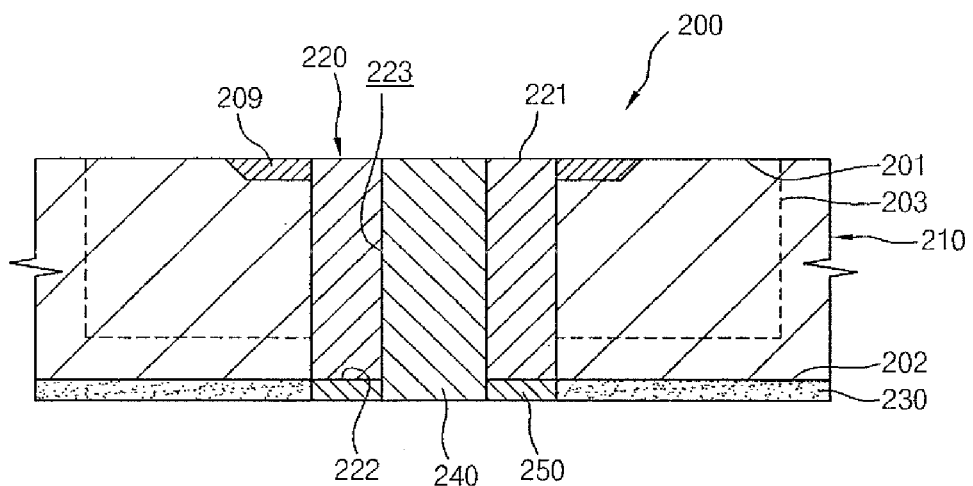
FIG. 6 is a cross-sectional view illustrating a semiconductor package in accordance with another embodiment of the present invention.

FIG. 6 depicts a cross-sectional view illustrating a semiconductor package in accordance with another embodiment of the present invention.

Referring to FIG. 6, a semiconductor package 200 includes a semiconductor chip 210, through-electrodes 220 having heat conductive members 240, and connection members 250. In addition, the semiconductor package 200 can also include an adhesive member 230.

The semiconductor chip 210 can have any known geometric shape in which, for example, the semiconductor chip 210 can have a rectangular hexahedral shape. The semiconductor chip 210 having the rectangular hexahedral shape has an upper surface 201 and a lower surface 202 which faces away from the upper surface 201. The semiconductor chip 210 includes a circuit section 203 which can have any number of circuit related components such as a data storage unit (not shown) for storing data and a data processing unit (not shown) for processing data.

Each through-electrode 220 passes through the upper surface 201 and the lower surface 202 of the semiconductor chip 210 and is electrically connected with the circuit section 203. Accordingly, an input signal transmitted from an external part can be inputted to the circuit section 203 from the through-electrode 220, and an output signal outputted from the circuit section 203 can be transmitted to the external part through the through-electrode 220.

In an embodiment, the through-electrode 220 can contain any electrically conductive material, such as copper which is well known to exhibit excellent electrical and heat conductivities. Alternately, the through-electrode 220 can of course contain aluminum, aluminum alloys, copper alloys, silver, silver alloys, that are also well known to exhibit excellent electrical and thermal conductivities.

In the illustrative embodiment, the through-electrode 220 is shown to have a first end 221 which roughly corresponds to the upper surface 201 of the semiconductor chip 210 and a second end 222 which roughly corresponds to the lower surface 202 of the semiconductor chip 210.

The second end 222 of the through-electrode 220 can be aligned on substantially the same plane as the lower surface 202 of the semiconductor chip 210. Alternately, the second end 222 of the through-electrode 220 can protrude outward from the lower surface 202 of the semiconductor chip 210 at a predetermined distance.

In order to improve heat dissipation efficiency of the semiconductor chip 210 by utilizing the through-electrode 220, the through-electrode 220 has a through-hole 223 that passes through the first and second ends 221 and 222 of the through-electrode 220.

Each connection member 250 is disposed around the second end 222 of the through-electrode 220. In this illustrative embodiment, the connection member 250 may have a ring shape with an inner diameter that is the substantially the same as the diameter of the through-hole 223, to be placed around the second end 222 of the through-electrode 220. In the embodiment, the connection member 250 can comprise an electrically conductive material such as solder.

Each heat conductive member 240 is disposed in the through-hole 223 and through the connection member 250. The heat conductive member 240 can contain a thermally conductive substance, for example, such as heat conductive grease or a heat conductive epoxy resin. The heat conductive member 240 is filled into the through-hole 223 and inside the connection member 250.

In an embodiment, the heat conductive member 240 can have pores (not shown) that are created by heat-pressing beads containing a heat conductive substance, so as to improve heat transfer efficiency.

In an embodiment, in order to maximize heat transfer efficiency, the through-electrode 220 can have a first volume and the heat conductive member 240 can have a second volume greater than the first volume. Alternately, the through-electrode 220 can have a first volume, and the heat conductive member 240 can have a second volume less than the first volume.

FIGS. 7 through 10 are cross-sectional views illustrating a method for manufacturing the semiconductor package shown in FIG. 6 in accordance with another embodiment of the present invention.

Figure 7:
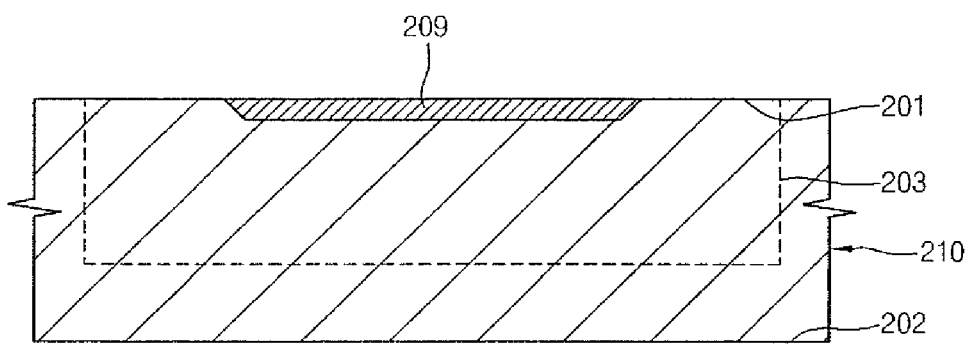
FIGS. 7 through 10 are cross-sectional views illustrating a method for manufacturing the semiconductor package shown in FIG. 6 in accordance with another embodiment of the present invention.

Referring to FIG. 7, a semiconductor chip 210, which is formed with a circuit section 203 that may have a data storage unit (not shown) and/or a data processing unit (not shown), is manufactured through a semiconductor chip manufacturing process. Bonding pads 209, which are electrically connected with the circuit section 203, are formed on an upper surface 201 of the semiconductor chip 210.

Figure 8:
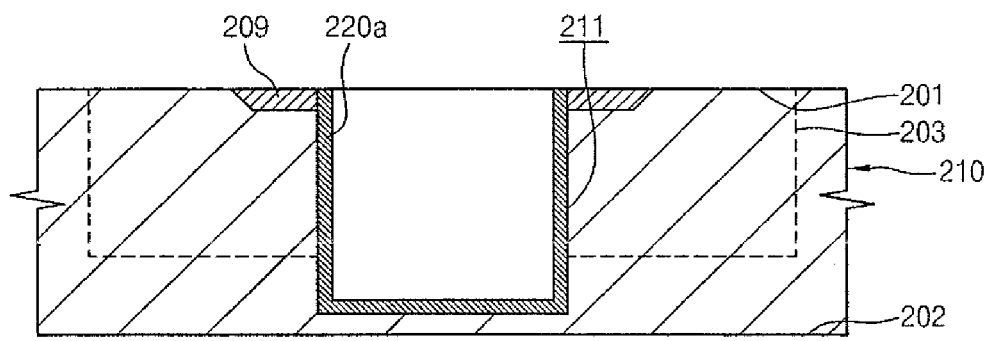

Referring to FIG. 8, after the semiconductor chip 210 is manufactured, a blind via 211 is defined from the upper surface 201 toward a lower surface 202, facing away from the upper surface 201, of the semiconductor chip 210. The blind via 211 can be prepared by any known methodology such as using a drilling process, a laser drilling process or an etching process. In the embodiment, the blind via 211 is defined at a position corresponding to, for example, each bonding pad 209.

After the blind via 211 is prepared and defined, a preliminary through-electrode 220a is formed to cover the inner side surface and the bottom surface of the semiconductor chip 210 which are formed by defining the blind via 211. The preliminary through-electrode 220a can contain, for example, copper having excellent conductivity characteristics.

Figure 9:
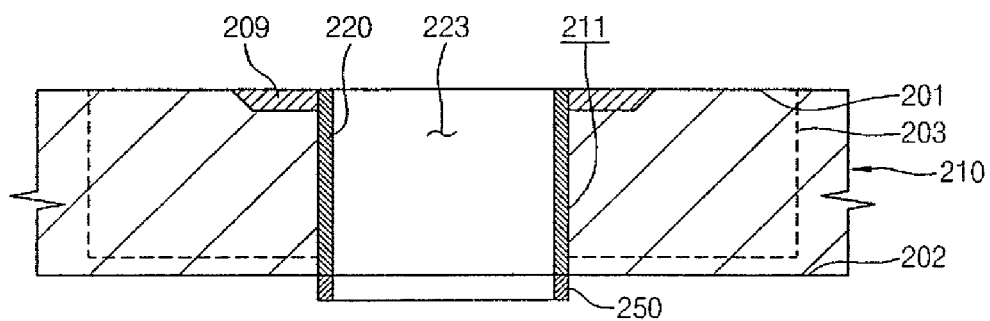

Referring to FIG. 9, after the preliminary through-electrode 220a is formed on the inner side surface and the bottom surface of the semiconductor chip 210, the lower surface 202 of the semiconductor chip 210 is etched by using an etch-back process or a CMP (chemical mechanical polishing) process. As a result, the through-electrode 220 is subsequently formed which is exposed at the lower surface 202 of the semiconductor chip 210.

After the through-electrode 220 is formed, a connection member 250 is disposed on the lower end surface of the through-electrode 220. The connection member 250 may have a ring shape that has an opening, and may contain solder. The connection member 250 extends downward from the lower surface 202 of the semiconductor chip 210 by a predetermined thickness.

Figure 10:
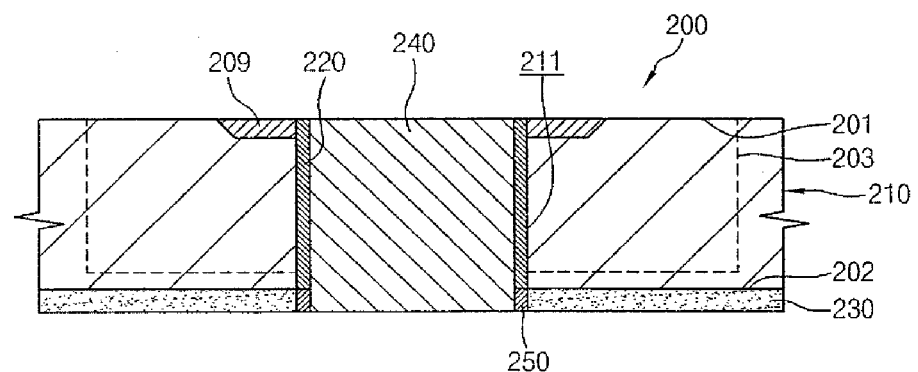

Referring to FIG. 10, after the connection member 250 is formed, an adhesive member 230, which has an opening for exposing the connection member 250, is disposed on the lower surface 202 of the semiconductor chip 210.

A heat conductive member 240 is filled into the through-electrode 220 and into the connection member 250 preferably using a stencil process whereby the semiconductor package 200 is manufactured. Examples of materials that can be used to form the heat conductive member 240 may include heat conductive grease, heat conductive epoxy resin, etc.

Figure 11:
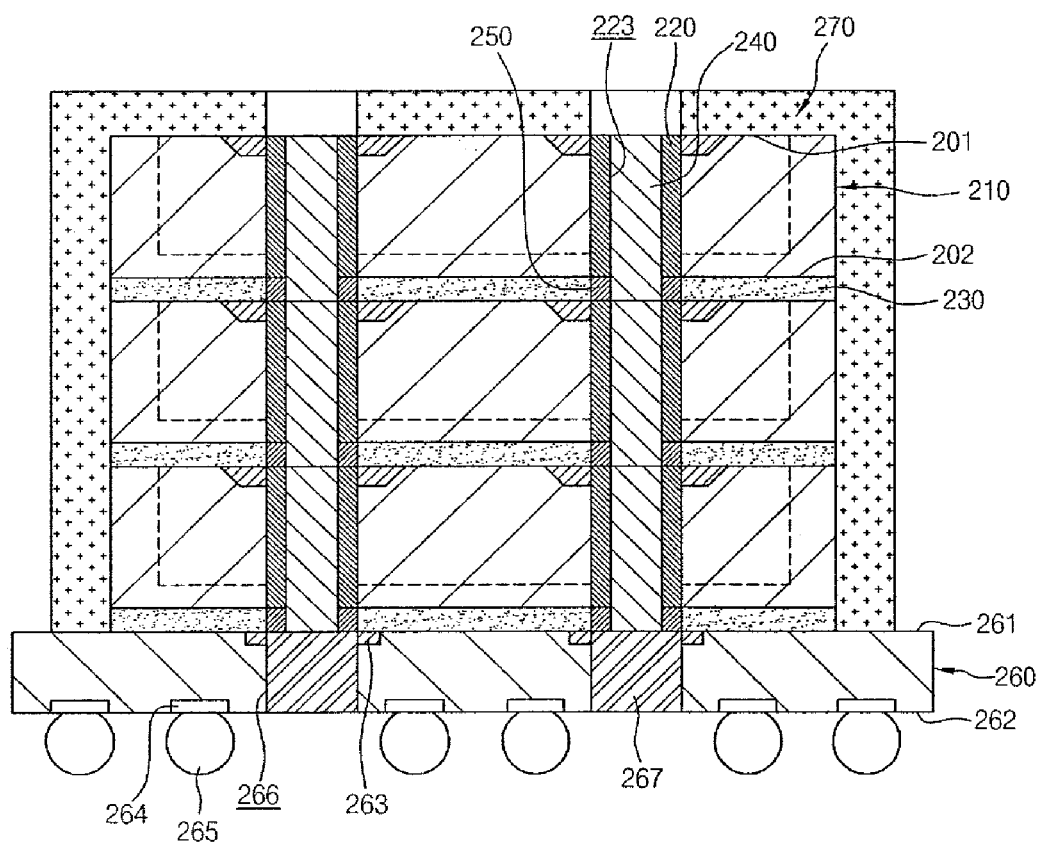
FIG. 11 is a cross-sectional view illustrating a semiconductor package in accordance with another embodiment of the present invention.

FIG. 11 is a cross-sectional view illustrating a semiconductor package in accordance with another embodiment of the present invention. The semiconductor package shown in FIG. 11 has substantially the same construction as the semiconductor package described above with reference to FIG. 6, except a substrate 260 and a molding member 270. Therefore, description for the same component parts will be omitted herein, and the same technical terms and the same reference numerals will be used to refer to the same or like component parts.

Referring to FIG. 11, a semiconductor package 200 includes semiconductor chips 210, through-electrodes 220, adhesive members 230, heat conductive members 240, connection members 250, a substrate 260, and a molding member 270.

As shown in FIG. 11, at least two semiconductor chips 210, are shown which have the through-electrodes 220 having the heat conductive members 240 filled in through-holes 223 defined through the semiconductor chips 210, adhere to one another by the respective adhesive members 230. The heat conductive members 240, which are filled in the respective through-holes 223 of the semiconductor chips 210, are connected with one another.

The semiconductor chips 210 adhere to one another by the adhesive members 230 which are attached to the substrate 260. The substrate 260 has a chip region CR and a peripheral region PR which is defined around the chip region CR. The stacked semiconductor chips 210 are securely disposed in the chip region CR of the substrate 260 by the adhesive member 230 which is attached to the semiconductor chip 210 positioned lowermost among the semiconductor chips 210 adhered to one another.

Connection pads 263 are formed on an upper surface 261 of the substrate 260. The connection pads 263 are electrically connected to the through-electrodes 220 of the lowermost semiconductor chip 210 by the medium of the connection members 250. Ball lands 264, which are electrically connected to the connection pads 263, are disposed on a lower surface 262 of the substrate 260, facing away from the upper surface 261. Connection members 265, such as solder balls, are disposed on the ball lands 264. Heat dissipation blocks 267 are formed through the substrate 260 that contact the heat conductive members 240. The heat dissipation blocks 267 can comprise the same material as that of the heat conductive members 240 or alternately any metal that exhibits excellent thermal conductivity.

The molding member 270 covers the side surfaces and the upper surface of the stacked semiconductor chips 210. The molding member 270 comprises a molding element such as epoxy resin. The molding member 270, which covers the semiconductor chips 210, has openings, which expose the respective heat conductive members 240 filled in the respective through-electrodes 220 of the uppermost semiconductor chip 210.

In the embodiment of the present invention, through-holes are defined in through-electrodes which electrically connect a plurality of semiconductor chips, and heat conductive members are formed in the through-holes. As a consequence, the high temperature heat generated in the semiconductor chips can be easily dissipated to an outside, whereby the operational characteristics of the semiconductor chips can be significantly improved.

Figure 12:
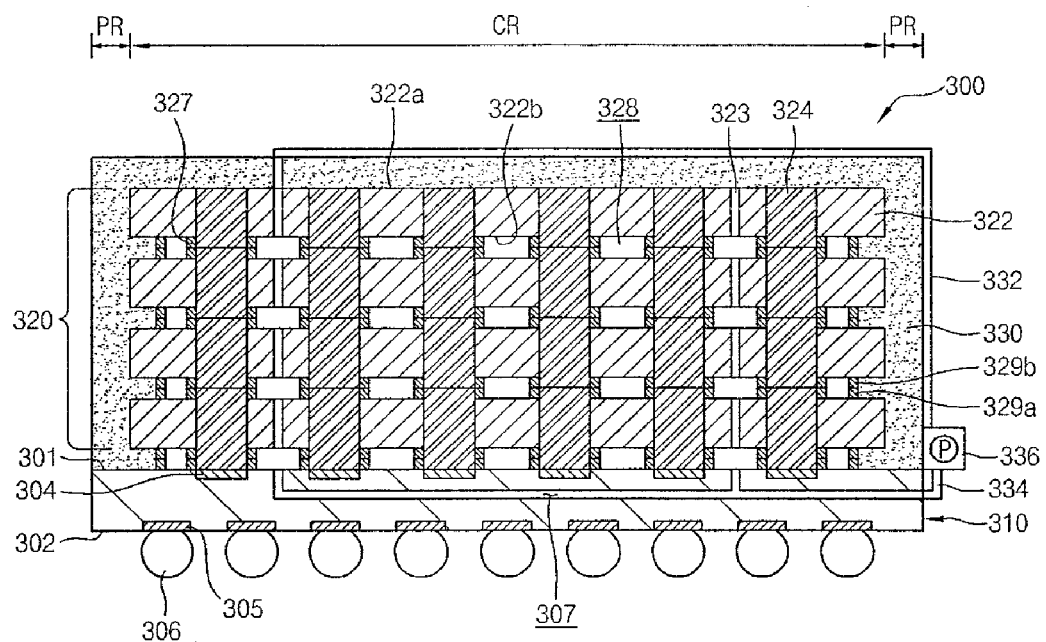
FIG. 12 is a cross-sectional view illustrating a semiconductor package in accordance with another embodiment of the present invention.

FIG. 12 is a cross-sectional view illustrating a semiconductor package in accordance with still yet another embodiment of the present invention.

Referring to FIG. 12, a semiconductor package 300 includes a substrate 310, a semiconductor chip module 320, and a molding member 330.

The substrate 310 comprises, for example, a printed circuit board which has a rectangular hexahedral shape. The substrate 310 has a chip region CR and a peripheral region PR. The chip region CR is defined at the center portion of the substrate 310, and the peripheral region PR is defined around the chip region CR.

Connection pads 304 are disposed on an upper surface 301 of the substrate 310 in the chip region CR. In an embodiment, the connection pads 304 can be disposed not only in the chip region CR but also in the peripheral region PR. Otherwise, the connection pads 304 can be disposed only in the peripheral region PR.

Ball lands 305 are disposed on a lower surface 302 of the substrate 310, facing away from the upper surface 301. The ball lands 305 are electrically connected with the connection pads 304.

In addition to the connection pads 304 and the ball lands 305, the substrate 310 has a path 307. The path 307 that extends from the chip region CR to the peripheral region PR. One end of the path 307 communicates with the chip region CR, and the other end of the path 307 facing away from the one end communicates with the peripheral region PR. Connection members 306, such as solder balls, are disposed on the ball lands 305.

The semiconductor chip module 320 is disposed in the chip region CR. The semiconductor chip module 320 includes at least two semiconductor chips 322. The semiconductor chips 322 are stacked in the vertical direction on the upper surface 301 of the substrate 310.

Each of the semiconductor chips 322 of the semiconductor chip module 320 has through-holes 323 and through-electrodes 324.

The through-holes 323 pass through an upper surface 322a and a lower surface 322b, facing away from the upper surface 322a, of each semiconductor chip 322 and have a first diameter. The through-holes 323 of adjoining semiconductor chips 322 can be defined at the same positions. Alternately, the through-holes 323 of adjoining semiconductor chips 322 can be defined at different positions.

The through-electrodes 324 are formed at positions separated from the through-holes 323. The through-electrodes 324 pass through the upper surface 322a and the lower surface 322b of each semiconductor chip 322 and have a second diameter greater than the first diameter. The through-electrodes 324 can contain, for example, copper. The through-electrodes 324 of the respective semiconductor chips 322 are formed at designated positions, and due to this fact, the through-electrodes 324 of adjoining semiconductor chips 322 are electrically connected with each other.

One end or both ends of each through-electrode 324 project from the upper surface 322a and the lower surface 322b of the semiconductor chip 322 by a preselected thickness. Protective layers 327 for preventing corrosion of the through-electrode 324 are formed around the projecting portions of the through-electrode 324. The protective layers 327 which are formed around the projecting portions of the through-electrode 324 can comprise gold layers or insulation layers.

The through-electrodes 324 of the semiconductor chip module 320 are electrically connected with the connection pads 304 which are formed on the substrate 310.

The molding member 330 covers the side surfaces and the upper surface of the semiconductor chip module 320. The molding member 330 closes the spaces defined between adjoining semiconductor chips 322 of the semiconductor chip module 320 such that cooling spaces 328 are defined between the semiconductor chips 322. Since the gap between adjoining semiconductor chips 322 is narrow, the molding member 330 is disposed along the edges of the semiconductor chips 322.

In an embodiment, in order to prevent the cooling spaces 328 from being occupied by the molding member 330, adhesive sealing members 329a and 329b can be formed on the upper surface 322a and the lower surface 322b of the semiconductor chips 322 as shown in FIG. 12. The adhesive sealing members 329a and 329b can be formed adjacent to the edges of the upper surfaces 322a and the edges of the lower surfaces 322b of the semiconductor chips 322 in the form of a closed loop. The height of the adhesive sealing members 329a and 329b can be substantially the same as, for example, the projecting thickness of the projecting portions of the through-electrodes 324 which project from the upper surfaces 322a and the lower surfaces 322b of the semiconductor chips 322. Unlike this, the adhesive sealing members 329a and 329b can be disposed only on the upper surfaces 322a or the lower surfaces 322b of the semiconductor chips 322, and in this case, the height of the adhesive sealing members 329a and 329b is substantially the same as the size of the gaps defined between adjoining semiconductor chips 322.

The molding member 330 has an opening which exposes the through-hole 323 of the semiconductor chip 322 which is placed uppermost among the semiconductor chips 322 of the semiconductor chip module 320.

A first pipe 332 is connected to the opening of the molding member 330, and a second pipe 334 is connected to the path 307 of the substrate 310. The first and second pipes 332 and 334 are connected to each other by a circulation pump 336 which has a heat exchanger. The cooling spaces 328 of the semiconductor chip module 320 can be filled with a refrigerant (or cooling fluid) for dissipating the heat generated in the semiconductor chips 322 to an outside of the molding member 330. In an embodiment, the first pipe 332 and the second pipe 334 can of course be disposed in the molding member 330 so as to protect the first and second pipes 332 and 334 from being destroyed.

In an embodiment, it can be envisaged that the opening of the molding member 330 is closed by a first sealing member, the path 307 of the substrate 310 is closed by a second sealing member, the cooling spaces 328 are filled with a refrigerant, and a circulation pump for circulating the refrigerant (or cooling fluid) is disposed in the cooling space 328.

FIGS. 13 through 17 are cross-sectional views illustrating a method for manufacturing the semiconductor package shown in FIG. 12 in accordance with another embodiment of the present invention.

Figure 13:
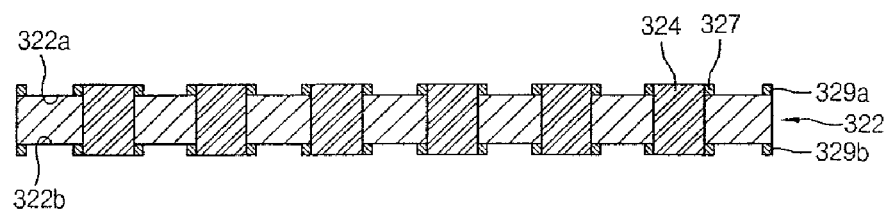
FIGS. 13 through 17 are cross-sectional views illustrating a method for manufacturing the semiconductor package shown in FIG. 12 in accordance with another embodiment of the present invention.

Referring to FIG. 13, for example, a process for manufacturing a semiconductor chip module 320 is conducted. In order to manufacture the semiconductor chip module 320, semiconductor chips 322 are first manufactured on a wafer through a semiconductor device manufacturing process.

After the semiconductor chips 322 are manufactured, through-electrodes 324 are formed that pass through upper surfaces 322a and lower surfaces 322b, facing away from the upper surfaces 322a, of the semiconductor chips 322. The through-electrodes 324 are formed by using a plating process. The through-electrodes 324 project from the upper surfaces 322a and the lower surfaces 322b of the semiconductor chips 322 by a preselected thickness. Protective layers 327 for preventing the corrosion of the through-electrodes 324 from being formed around the projecting portions of the through-electrodes 324 which project from the upper surfaces 322a and the lower surfaces 322b of the semiconductor chips 322. The protective layers 327 can comprise, for example, gold layers or insulation layers.

Adhesive sealing members 329a and 329b are formed on the upper surfaces 322a and the lower surfaces 322b of the semiconductor chips 322 along the edges of the upper surfaces 322a and the lower surfaces 322b in the form of a closed loop. For example, the adhesive sealing members 329a and 329b can have substantially the same thickness as the projecting thickness of the through-electrodes 324.

Figure 14:
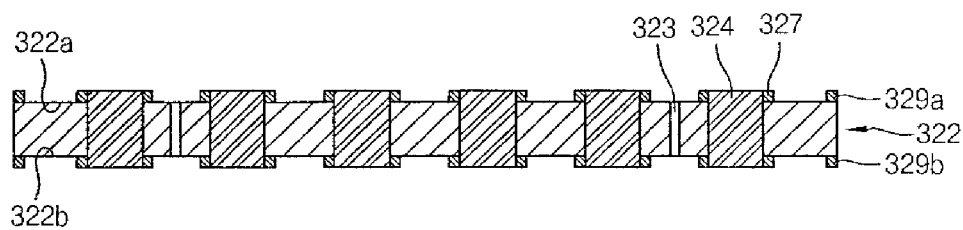

Referring to FIG. 14, after the through-electrodes 324 are formed through the semiconductor chips 322, through-holes 323 are defined to pass through the upper surfaces 322a and the lower surfaces 322b of the semiconductor chips 322. In the embodiment, the through-holes 323 can be defined at two or more places of each semiconductor chip 322. In the embodiment, the through-holes 323 are defined to have a diameter, for example, less than that of the through-electrodes 324.

Figure 15:
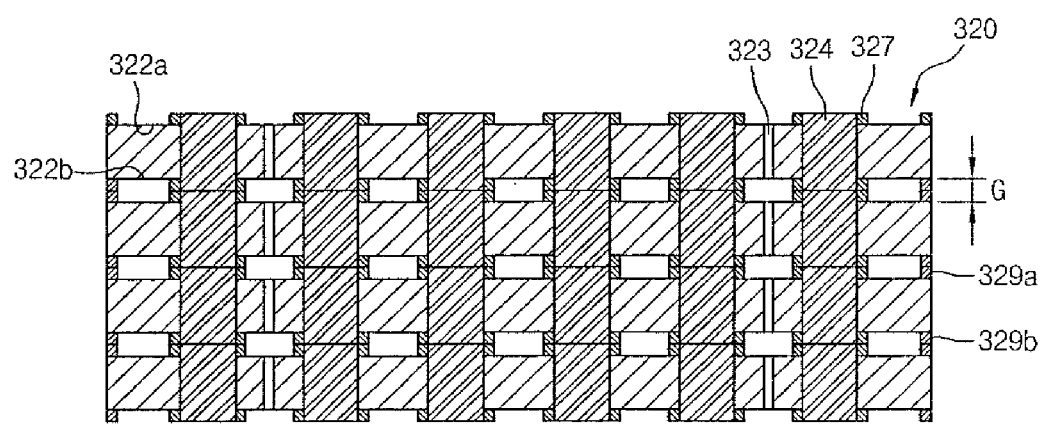

Referring to FIG. 15, at least two semiconductor chips 322 defined with the through-holes 323 are stacked upon each other, and the through-holes 324 of the stacked semiconductor chips 322 communicate with one another, for example, in a serial communication type, whereby the semiconductor chip module 320 is manufactured. Gaps G are defined between the stacked semiconductor chips 322 to have a size that is determined by the projecting portions of the through-electrodes 324 which project from the semiconductor chips 322.

Figure 16:
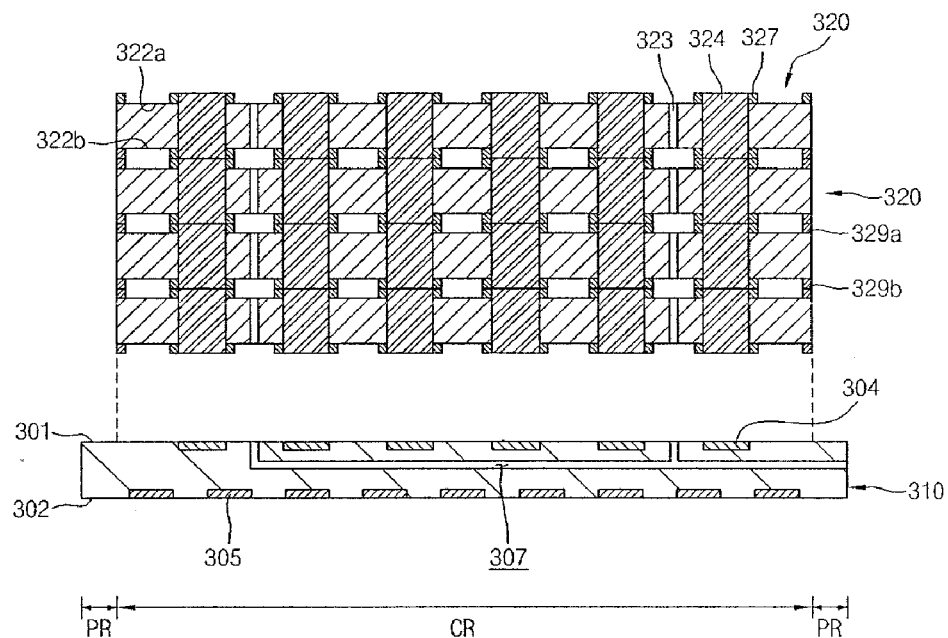

Referring to FIG. 16, after the semiconductor chip module 320 is manufactured, the through-electrodes 324 of the semiconductor chip module 320 are electrically connected to connection pads 304 which are formed in a chip region CR of a substrate 310. A path 307 is defined in the substrate 310. One end of the path 307 is placed in the chip region CR, and the other end of the path 307 is placed in a peripheral region PR which is formed around the chip region CR.

Figure 17:
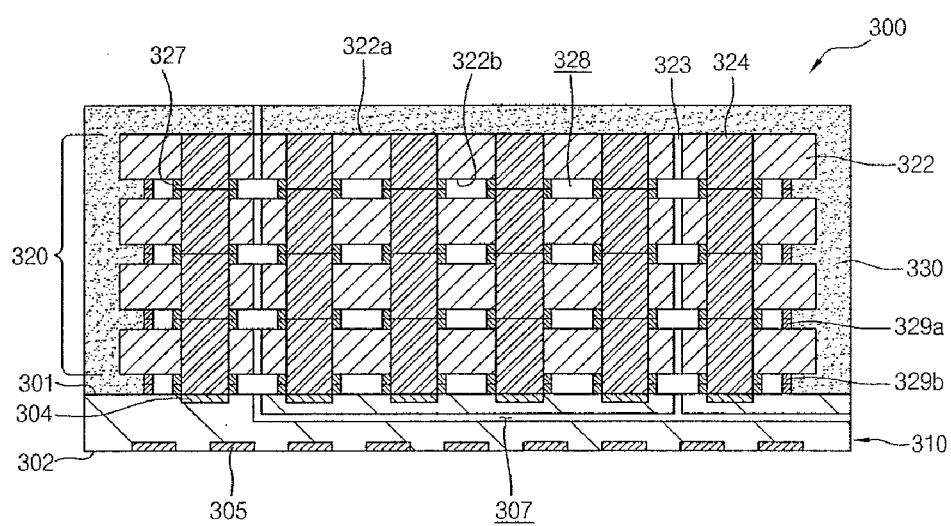

Referring to FIG. 17, after the semiconductor chip module 320 is mounted to the substrate 310, the substrate 310 and the semiconductor chip module 320 are placed in a mold, and a molding member 330 is formed by the fact that the substrate 310 and the semiconductor chip module 320 are molded by a molding material which is introduced into the mold. At this time, by adjusting the pressure of the molding material, the side surfaces and the upper surface of the semiconductor chip module 320 are covered by the molding member 330, and cooling spaces 328 are defined between the semiconductor chips 322 of the semiconductor chip module 320. The cooling spaces 328 communicate with the through-holes 323 of the respective semiconductor chips 322. An opening is defined through the molding member 330 to communicate with the through-hole 323 of the uppermost semiconductor chip 322.

Referring back to FIG. 12, a first pipe 332 is connected to the opening of the molding member 330 which fluidly communicates with the through-hole 323, and a second pipe 334 is connected to the path 307 which is defined in the peripheral region PR of the substrate 310. The first and second pipes 332 and 334 are fluidly connected with each other by a circulation pump 336 which has a heat exchanger (not shown). The cooling spaces 328 are filled with a refrigerant (or cooling fluid) circulated by the circulation pump 336. Alternately, it can be envisaged that, after a refrigerant is filled in the cooling spaces 328, the opening of the molding member 330 and the path 307 of the substrate 310 are respectively closed by first and second sealing members, and then the refrigerant is circulated by a circulation pump disposed in the cooling space 328.

Although a structure and a method for defining paths in a substrate and circulating cooling fluid through the paths were illustrated and explained in the embodiment of the present invention, unlike this, paths can be defined in a molding member, and hollow pipes can be disposed in the molding member instead of defining paths in the substrate and the molding member in the form of passages.

In the embodiment of the present invention, through-holes are defined through stacked semiconductor chips so that cooling fluid can be circulated through the through-holes, and cooling spaces are defined between the semiconductor chips to communicate with the through-holes. As a consequence, the semiconductor chips can be rapidly cooled, and since it is not necessary to form gapfill members between the semiconductor chips, the number of processes for manufacturing a semiconductor package can be decreased.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
   a substrate having
      a chip region,
      a peripheral region around the chip region, and
      a path that extends from the chip region to the peripheral region;
   a semiconductor chip module having a plurality of semiconductor chips stacked in the chip region separately from each other and defined with through-holes passing through the semiconductor chips and defined with cooling spaces between adjoining stacked semiconductor chips; and
   a molding member covering side surfaces and an upper surface of the semiconductor chip module defining a connection path in fluid communications with the through-holes and cooling spaces defined by the stacked semiconductor chips and with the path of the substrate.

2. The semiconductor package according to claim 1, wherein the substrate includes connection pads in the chip region, and the semiconductor chip module has through-electrodes that pass through the stacked semiconductor chips and are electrically connected to the connection pads.

3. The semiconductor package according to claim 2, wherein any one of a gold layer and an insulation layer is formed on a side surface of the through-electrode to protect against corrosion of the through-electrode.

4. The semiconductor package according to claim 2, wherein a through-electrode hole for forming the through-electrode has a diameter greater than a diameter of the through-hole.

5. The semiconductor package according to claim 1, further comprising:
   a first pipe fluidly connected to the connection path of the molding member;
   a second pipe fluidly connected to the path of the substrate; and
   a circulation pump fluidly connected to the first and second pipes, the circulation pump for circulating cooling fluid filled within the first and second pipes and the cooling spaces.

6. The semiconductor package according to claim 1, further comprising:
   adhesive sealing members adjacent to upper and lower surfaces of the stacked semiconductor chips and which are formed around the cooling spaces.

7. The semiconductor package according to claim 1, wherein through-holes of a lower one of the stacked semiconductor chips which is placed downward among the stacked semiconductor chips and through-holes of an upper one of the semiconductor chips are aligned together to fluidly communicate with each other.

8. The semiconductor package according to claim 1, further comprising adhesive sealing members formed along edges of upper surfaces and lower surfaces of the stacked semiconductor chips inhibit the molding member from flowing into the cooling spaces.

9. The semiconductor package according to claim 8, wherein a height of the adhesive sealing member is about half or the same that of a distance between adjoining stacked semiconductor chips.

10. A semiconductor package comprising:
    a substrate having
       a chip region,
       a peripheral region around the chip region, and
       a path that extends from the chip region to the peripheral region;
    a plurality of semiconductor chips stacked together forming cooling spaces between adjoining stacked semiconductor chips, wherein each semiconductor chip comprises:
       an upper surface;
       a lower surface;
       through-holes that pass between the upper and lower surfaces, wherein through-holes and cooling spaces of the adjoining stacked semiconductor chips are in fluid communications with each other; and
       through-electrodes that pass between the upper and lower surfaces, wherein through-electrodes of adjoining stacked semiconductor chips are in electrical communications with each other; and
    a molding member covering stacked semiconductor chips such that the molding member defines a connection path in fluid communications with the through-holes and cooling spaces.

11. The semiconductor package according to claim 10, further comprising:
    a first pipe fluidly connected to the connection path of the molding member;
    a second pipe fluidly connected to the path of the substrate; and
    a circulation pump fluidly connected to the first and second pipes, the circulation pump for circulating cooling fluid filled within the first and second pipes, the cooling spaces and the through-holes.

12. The semiconductor package according to claim 11, wherein the first and second pipes are disposed within the molding member.

13. The semiconductor package according to claim 10, further comprising:
    adhesive sealing members adjacent to upper and lower surfaces of the stacked semiconductor chips and which are formed around the cooling spaces.

14. The semiconductor package according to claim 10, further comprising adhesive sealing members formed along edges of upper surfaces and lower surfaces of the stacked semiconductor chips that inhibit the molding member from flowing into the cooling spaces.

15. The semiconductor package according to claim 14, wherein a height of the adhesive sealing member is about half or the same that of a distance between adjoining stacked semiconductor chips.

16. The semiconductor package according to claim 10, further comprising:
    connection pads electrically connected to through-electrodes of the semiconductor chips;
    ball lands electrically connected to the connection pads; and
    connection members electrically connected to the ball lands.

17. The semiconductor package according to claim 10, wherein the through-electrodes contain electrically conductive material selected from the group consisting of copper, aluminum, silver, and alloys thereof.

* * * * *